United States Patent
Gadgil et al.

[19]

[11] Patent Number: 5,879,459
[45] Date of Patent: Mar. 9, 1999

[54] VERTICALLY-STACKED PROCESS REACTOR AND CLUSTER TOOL SYSTEM FOR ATOMIC LAYER DEPOSITION

[75] Inventors: Prasad N. Gadgil, Santa Clara; Thomas E. Seidel, Sunnyvale, both of Calif.

[73] Assignee: Genus, Inc., Sunnyvale, Calif.

[21] Appl. No.: 920,708

[22] Filed: Aug. 29, 1997

[51] Int. Cl.⁶ ................................................. C23C 16/00
[52] U.S. Cl. ........................... 118/715; 118/725; 118/729
[58] Field of Search ..................................... 118/715, 725, 118/729

[56] References Cited

U.S. PATENT DOCUMENTS

| | | | |
|---|---|---|---|
| 4,533,410 | 8/1985 | Ogura et al. | 148/175 |
| 4,533,820 | 8/1985 | Shimizu | 219/411 |
| 4,689,247 | 8/1987 | Doty et al. | 427/126.1 |
| 4,828,224 | 5/1989 | Crabb et al. | 251/298 |
| 4,836,138 | 6/1989 | Robinson et al. | 118/666 |
| 4,846,102 | 7/1989 | Ozias | 118/730 |
| 4,976,996 | 12/1990 | Monkowski et al. | 427/255.5 |
| 4,993,360 | 2/1991 | Nakamura | 118/719 |
| 5,077,875 | 1/1992 | Hoke et al. | 29/25.01 |
| 5,119,760 | 6/1992 | McMillan et al. | 118/722 |
| 5,194,401 | 3/1993 | Adams et al. | 437/173 |
| 5,336,327 | 8/1994 | Lee | 118/730 |
| 5,749,974 | 5/1998 | Hakuba et al. | 118/725 |
| 5,788,447 | 8/1998 | Yonemitsu et al. | 414/217 |

FOREIGN PATENT DOCUMENTS

| | | |
|---|---|---|
| 60-10625 A | 1/1985 | Japan . |
| 2-152251 A | 6/1990 | Japan . |
| 5-152215 A | 6/1993 | Japan . |

*Primary Examiner*—Bruce Breneman
*Assistant Examiner*—Jeffrie Lund
*Attorney, Agent, or Firm*—Donald R. Boys

[57] ABSTRACT

A low profile, compact atomic layer deposition reactor (LP-CAR) has a low-profile body with a substrate processing region adapted to serve a single substrate or a planar array of substrates, and a valved load and unload port for substrate loading and unloading to and from the LP-CAR. The body has an inlet adapted for injecting a gas or vapor at the first end, and an exhaust exit adapted for evacuating gas and vapor at the second end. The LP-CAR has an external height no greater than any horizontal dimension, and more preferably no more than two-thirds any horizontal dimension, facilitating a unique system architecture. An internal processing region is distinguished by having a vertical extent no greater than one fourth the horizontal extent, facilitating fast gas switching. In some embodiments one substrate at a time is processed, and in other embodiments there may be multiple substrates arranged in the processing region in a planar array. The compact reactor is distinguished by individual injectors, each of which comprise a charge tube formed between a charge valve and an injection valve. The charge valve connects the charge tube to a pressure regulated supply, and the injection valve opens the charge tube into the compact reactor. Rapidly cycling the valves injects fixed mass-charges of gas or vapor into the compact reactor. Multiple such compact reactors are stacked vertically, interfaced into a vacuum handling region having a Z-axis robot and a load/unload opening.

25 Claims, 10 Drawing Sheets

Vertically Stacked Compact ALD Reactor (VESCAR) System

VERTICALLY-STACKED PROCESS REACTOR AND CLUSTER TOOL SYSTEM FOR ATOMIC LAYER DEPOSITION

FIELD OF THE INVENTION

The present invention is in the field of thin film technology for coating substrates in the manufacture of semiconductor devices, and has particular application to Atomic Layer Deposition (ALD).

BACKGROUND OF THE INVENTION

In the field of thin film technology requirements for thinner deposition layers, better uniformity over increasingly larger area substrates, larger production yields, and higher productivity have been, and still are, driving forces behind emerging technologies developed by equipment manufactures for coating substrates in the manufacturing of various semiconductor devices. For example, process control and uniform film deposition achieved in the production of a microprocessor directly effect clock frequencies that can be achieved. These same factors in combination with new materials also dictate higher packing densities for memories that are available on a single chip or device. As these devices become smaller, the need for greater uniformity and process control regarding layer thickness rises dramatically.

Various technologies well known in the art exist for applying thin films to substrates or other substrates in manufacturing steps for integrated circuits (ICs). Among the more established technologies available for applying thin films, Chemical Vapor Deposition (CVD) and a variation known as Rapid Thermal Chemical Vapor Deposition (RTCVD) are often-used, commercialized processes. Atomic Layer Deposition (ALD), a variant of CVD, is a relatively new technology now emerging as a potentially superior method for achieving uniformity, excellent step coverage, and transparency to substrate size. ALD however, exhibits a generally lower deposition rate (typically about 100 Å/min) than CVD and RTCVD (typically about 1000 Å/min).

Both CVD and RTCVD are flux-dependent applications requiring specific and uniform substrate temperature and precursors (chemical species) to be in a state of uniformity in the process chamber in order to produce a desired layer of uniform thickness on a substrate surface. These requirements becomes more critical as substrate size increases, creating a need for more complexity in chamber design and gas flow technique to maintain adequate uniformity. For example, a 75 mm substrate processed in a reactor chamber would require less process control relative to gas flow, uniform heat, and precursor distribution than a 200 mm substrate would require with the same system; and substrate size is going to 300 mm dia., and 400 mm. dia is on the horizon.

Another problem in CVD coating, wherein reactants and the products of reaction coexist in a close proximity to the deposition surface, is the probability of inclusion of reaction products and other contaminants in each deposited layer. Also reactant utilization efficiency is low in CVD, and is adversely affected by decreasing chamber pressure. Still further, highly reactive precursor molecules contribute to homogeneous gas phase reactions that can produce unwanted particles which are detrimental to film quality.

Companies employing the RTCVD process and manufacturers of RTCVD equipment have attempted to address these problems by introducing the concept of Limited Reaction Processing (LRP) wherein a single substrate is positioned in a reaction chamber and then rapidly heated with the aid of a suitable radiative source to deposit thin films. Rapid heating acts as a reactive switch and offers a much higher degree of control regarding thickness of films than is possible with some other processes. RTCVD offers advantages over CVD as well in shorter process times, generally lower process costs, and improved process control. At the time of the present patent application RTCVD is a promising new technique for deposition of ultra-thin and uniform films. RTCVD is being steadily introduced into the commercial arena from the R&D stages by a number of equipment manufactures.

Although RTCVD has some clear advantages over general CVD, there are inherent problems with this technology as well, such as the temperatures that are used in processing. Larger surfaces require more critically-controlled temperature, which, if not achieved, can result in warpage or dislocations in the substrate. Also, the challenge of providing a suitable chamber that is contaminant-free and able to withstand high vacuum along with rapid temperature change becomes more critical with larger surface area requirements.

Yet critical area of thin film technology is the ability of a system to provide a high degree of uniformity and thickness control over a complex topology inherent in many devices. This phenomena is typically referred to as step coverage. In the case of CVD, step-coverage is better than in line-of-sight physical vapor deposition (PVD) processes, but, in initial stages of deposition there can be non-preferential, simultaneous adsorption of a variety of reactive molecules leading to discrete nucleation. The nucleated areas (islands) continue to grow laterally and vertically and eventually coalesce to form a continuous film. In the initial stages of deposition such a film is discontinuous. Other factors, such as mean free path of molecules, critical topological dimensions, and precursor reactivity further complicate processing making it inherently difficult to obtain a high degree of uniformity with adequate step coverage over complex topology for ultra-thin films deposited via CVD. RTCVD has not been demonstrated to be materially better than convention CVD in step coverage.

ALD, although a slower process than CVD or RTCVD, demonstrates a remarkable ability to maintain ultra-uniform thin deposition layers over complex topology. This is at least partially because ALD is not flux dependent as described earlier with regards to CVD and RTCVD. This flux-independent nature of ALD allows processing at lower temperatures than with conventional CVD and RTCVD processes.

ALD processes proceed by chemisorption at the deposition surface of the substrate. The technology of ALD is based on concepts of Atomic Layer Epitaxy (ALE) developed in the early 1980s for growing of polycrystalline and amorphous films of ZnS and dielectric oxides for electroluminescent display devices. The technique of ALD is based on the principle of the formation of a saturated monolayer of reactive precursor molecules by chemisorption. In ALD appropriate reactive precursors are alternately pulsed into a deposition chamber. Each injection of a reactive precursor is separated by an inert gas purge. Each precursor injection provides a new atomic layer additive to previous deposited layers to form a uniform layer of solid film The cycle is repeated to form the desired film thickness.

A good reference work in the field of Atomic Layer Epitaxy, which provides a discussion of the underlying concepts incorporated in ALD, is Chapter 14, written by Tuomo Suntola, of the Handbook of Crystal Growth, Vol. 3, edited by D. T. J. Hurle, © 1994 by Elsevier Science B. V. The Chapter tittle is "Atomic Layer Epitaxy". This reference is incorporated herein by reference as background information.

To further illustrate the general concepts of ALD, attention is directed to FIG. 1a and FIG. 1b herein. FIG. 1a represents a cross section of a substrate surface at an early stage in an ALD process for forming a film of materials A and B, which in this example may be considered elemental materials. FIG. 1a shows a substrate which may be a substrate in a stage of fabrication of integrated circuits. A solid layer of element A is formed over the initial substrate surface. Over the A layer a layer of element B is applied, and, in the stage of processing shown, there is a top layer of a ligand y. The layers are provided on the substrate surface by alternatively pulsing a first precursor gas Ax and a second precursor gas By into the region of the surface. Between precursor pulses the process region is exhausted and a pulse of purge gas is injected.

FIG. 1b shows one complete cycle in the alternate pulse processing used to provide the AB solid material in this example. In a cycle a first pulse of gas Ax is made followed by a transition time of no gas input. There is then an intermediate pulse of the purge gas, followed by another transition. Gas By is then pulsed, a transition time follows, and then a purge pulse again. One cycle then incorporates one pulse of Ax and one pulse of By, each precursor pulse separated by a purge gas pulse.

As described briefly above, ALD proceeds by chemisorption. The initial substrate presents a surface of an active ligand to the process region. The first gas pulse, in this case Ax, results in a layer of A and a surface of ligand x. After purge, By is pulsed into the reaction region. The y ligand reacts with the x ligand, releasing xy, and leaving a surface of y, as shown in FIG. 1a. The process proceeds cycle after cycle, with each cycle taking about 1 second in this example.

The unique mechanism of film formation provided by ALD offers several advantages over previously discussed technologies. One advantage derives from the flux-independent nature of ALD contributing to transparency of substrate size and simplicity of reactor design and operation. For example, a 200 mm substrate will receive a uniform layer equal in thickness to one deposited on a 100 mm substrate processed in the same reactor chamber due to the self-limiting chemisorption phenomena described above. Further, the area of deposition is largely independent of the amount of precursor delivered, once a saturated monolayer is formed. This allows for a simple reactor design. Further still, gas dynamics play a relatively minor role in the ALD process, which eases design restrictions. Another distinct advantage of the ALD process is avoidance of high reactivity of precursors toward one-another, since chemical species are injected independently into an ALD reactor, rather than together. High reactivity, while troublesome in CVD, is exploited to an advantage in ALD. This high reactivity enables lower reaction temperatures and simplifies process chemistry development. Yet another distinct advantage is that surface reaction by chemisorption contributes to a near-perfect step coverage over complex topography.

Even though ALD is widely presumed to have the above-described advantages for film deposition, ALD has not yet been adapted to commercial processes in an acceptable way. The reasons have mostly to do with system aspects and architecture. For example, many beginning developments in ALD systems are taking a batch processor approach. This is largely because ALD has an inherently lower deposition rate than competing processes such as CVD and RTCVD. By processing several substrates at the same time (in parallel) in a batch reaction chamber, throughput can be increased.

Unfortunately, batch processing has some inherent disadvantages as well, and addressing the throughput limitations of ALD by batch processing seems to trade one set of problems for another. For example, in batch processor systems cross contamination of substrates in a batch reactor from substrate to substrate and batch-to-batch poses a significant problem. Batch processing also inhibits process control, process repeatability from substrate to substrate and batch to batch, and precludes solutions for backside deposition. All of these factors severely affect overall system maintenance, yield, reliability, and therefore net throughput and productivity. At the time of this patent application, no solutions are known in the industry to correct these problems associated with ALD technology as it applies to commercial production.

What is clearly needed is a unique and innovative high productivity ALD system architecture and gas delivery system allowing multiple substrates to be processed using low-profile compact reactor units while still providing attractive throughput and yield, and at the same time using expensive clean-room and associated production floor space conservatively. The present invention teaches a system approach that will effectively address and overcome the current limitations of ALD technology, leading to commercial viability for ALD systems.

SUMMARY OF THE INVENTION

In a preferred embodiment of the present invention, a low-profile, compact, atomic layer deposition reactor (LP-CAR) is provided, comprising a body having a length, a width, and a height, the height equal to or less than either the width or height, wherein the length and height define first and second sides opposite one another, and the width and height define first and second ends opposite one another; a substrate processing region within the body, adapted to enclose a substrate during processing; a load/unload port in the first side, the load/unload port opening to the substrate processing region and adapted for passing a substrate into and out of the substrate processing region; a retractable support pedestal extendable into the substrate processing region in the direction of the height, for supporting a substrate during processing; a remotely-operable vacuum valve connected to the first side, the vacuum valve adapted to open and close the load/unload opening executing a vacuum seal in the closed position; an inlet adapted for injecting a gas or vapor at the first end, and an exhaust exit adapted for evacuating gas and vapor at the second end.

In preferred embodiments the body height for the LP-CAR is no more than two-thirds of the larger of the length and width. There is also a heater adapted for heating a substrate supported on the support pedestal and cooling lines for passing coolant through a portion of the body. The gas inlet may have one or more valved charge tubes for injecting one of a gas or vapor into the substrate processing region, the charge tube comprising a volume closed at one end by a remotely operable charge valve and at the other end by a remotely operable injection valve, the end having the injection valve being connected to the gas inlet, such that with the injection valve closed and the charge valve open to a source of gas or vapor under pressure the charge tube may be charged with a specific quantity (number of atoms) of the gas or vapor, and with the charge valve closed and the injection valve open the specific quantity of gas or vapor may be expended into the substrate processing region.

In some embodiments there is a vacuum exhaust system connected to the exhaust exit, and there may be two or more charge tubes adapted to be connected to separate gas and vapor sources. There may be in addition a vacuum seal interface for applying the first side of the reactor through a wall of a vacuum chamber such that the load/unload port is in the vacuum chamber and the balance of the compact reactor is outside the vacuum chamber.

In preferred embodiments the LP-CAR the substrate processing region has a vertical extent and an horizontal extent, and the vertical extent is no more than one-fourth of the horizontal extent. Some units are for processing a single substrate per process cycle, wherein the horizontal extent is no more than 1.5 times the largest substrate dimension. Other units are adapted for processing multiple substrates per process cycle, and the substrates are presented in the processing region in a horizontal plane.

In another aspect of the invention a low-profile, compact, atomic layer deposition reactor (LP-CAR) is provided, comprising a body having a length, a width, and a height, wherein the length and height define first and second sides opposite one another, and the width and height define first and second ends opposite one another; a substrate processing region within the body, adapted to enclose a substrate during processing; an inlet adapted for injecting a gas or vapor at the first end; and an exhaust exit adapted for evacuating gas and vapor at the second end. The gas inlet comprises one or more valved charge tubes for injecting one of a gas or vapor into the substrate processing region, each charge tube comprising a volume closed at one end by a remotely operable charge valve and at the other end by a remotely operable injection valve, the end having the injection valve being connected to the gas inlet, such that with the injection valve closed and the charge valve open to a source of gas or vapor under pressure the charge tube may be charged with a specific mass of the gas or vapor, and with the charge valve closed and the injection valve open the specific mass of gas or vapor may be expended into the substrate processing region.

In this aspect there may be a load/unload port in the first side, the load/unload port opening to the substrate processing region and adapted for passing a substrate into and out of the substrate processing region; a retractable support pedestal extendable into the substrate processing region in the direction of the height, for supporting a substrate during processing; and a remotely-operable vacuum valve connected to the first side, the vacuum valve adapted to open and close the load/unload opening executing a vacuum seal in the closed position.

In some embodiments one substrate may be processed in each LP-CAR unit per cycle, and in others there may be multiple substrates processed. Further, there may be two or more charge tubes adapted to be connected to separate gas and vapor sources.

In yet another aspect of the invention a vertically-stacked compact atomic layer deposition reactor (VESCAR) processing unit is provided, comprising a vacuum handling region having a valved load/unload opening adapted for transferring substrates to be processed into and out of the vacuum handling region; a plurality of low profile, compact atomic layer deposition reactors (LP-CARs), each interfaced into the vacuum handling region by a valved substrate port, the plurality of LP-CARS arranged in a vertical stack one-above-the-other outside the vacuum handling region, such that the valved substrate ports of the compact reactors present a substantially vertical column of ports within the vacuum handling region; and a z-axis robot in the vacuum handling region. The z-axis robot is adapted to accept substrates transferred into the vacuum handling region by a transfer apparatus through the valved load/unload opening, to travel vertically to the level of each of the substrate ports, to extend to place substrates to and to receive substrates from each of the compact reactors through each of the valved substrate ports, and to place processed substrates on the transfer apparatus to be transferred through the load/unload port out of the vacuum handling region.

In some embodiments the Z-axis robot is programmable to follow pre-defined transfer sequences for substrates into the vacuum handling region, and into and out of individual ones of the compact reactors. Individual ones of the compact reactors comprise two or more gas injectors and a gas exhaust arranged such that injected gases travel across a substrate placed in the individual compact reactor. An individual gas injector comprises a charge tube having a remotely-operable charge valve at one end and a remotely-operable injection valve at the other, the charge valve adapted to connect the charge tube to a pressure regulated gas supply, and the injection valve adapted to connect the charge tube into the individual compact reactor. There may be two or more valved charge tubes adapted for injecting separate gases or vapors into the individual compact reactor. Operation of the remotely-operable charge valves and injection valves is programmable to integrate injection of separate gases or vapors into individual compact reactors in concert with transfer of substrates into and out of compact reactors through the valved substrate ports.

There are a number of ways VESCAR units may be arranged in production systems. For example, a unit may be combined with a cassette load/unload lock connected to the load/unload opening, the load/unload lock adapted with a vent and exhaust system and an outside door, such that a cassette of multiple unprocessed substrates may be placed into the load/unload lock, the load/unload lock may be evacuated, and individual substrates may then be transferred into and out of the individual compact reactors and back into the cassette in pre-programmed sequences. As another example, the VESCAR unit may be combined with a multi-position vacuum central robotic substrate handler, commonly known as a cluster-tool handler, connected by one transfer position to the load/unload opening, and a cassette load/unload lock connected to the cluster-tool handler, the load/unload lock adapted with a vent and exhaust system and an outside door, such that a cassette of multiple unprocessed substrates may be placed into the load/unload lock, the load/unload lock may be evacuated, and individual substrates may then be transferred through the cluster-tool handler and into and out of the individual compact reactors and back into the cassette in pre-programmed sequences.

Multiple VESCAR units may be integrated in some system embodiments with other process units, such as CVD, RTCVD, etching lithography units, and so forth.

The unique geometry and aspects of the compact reactor unit according to embodiments of the invention provide a unit capable of repeatable and controllable processing for film deposition in a manner that multiple units can be combined to maintain the advantages of isolated single substrate processing while providing also the advantages of processing a relatively large number of substrates simultaneously, as is required for high production throughput. In other aspects, system architecture is provided to accrue the above advantages while preserving costly available production space.

DESCRIPTION OF THE PREFERRED EMBODIMENTS

Figure 1A:
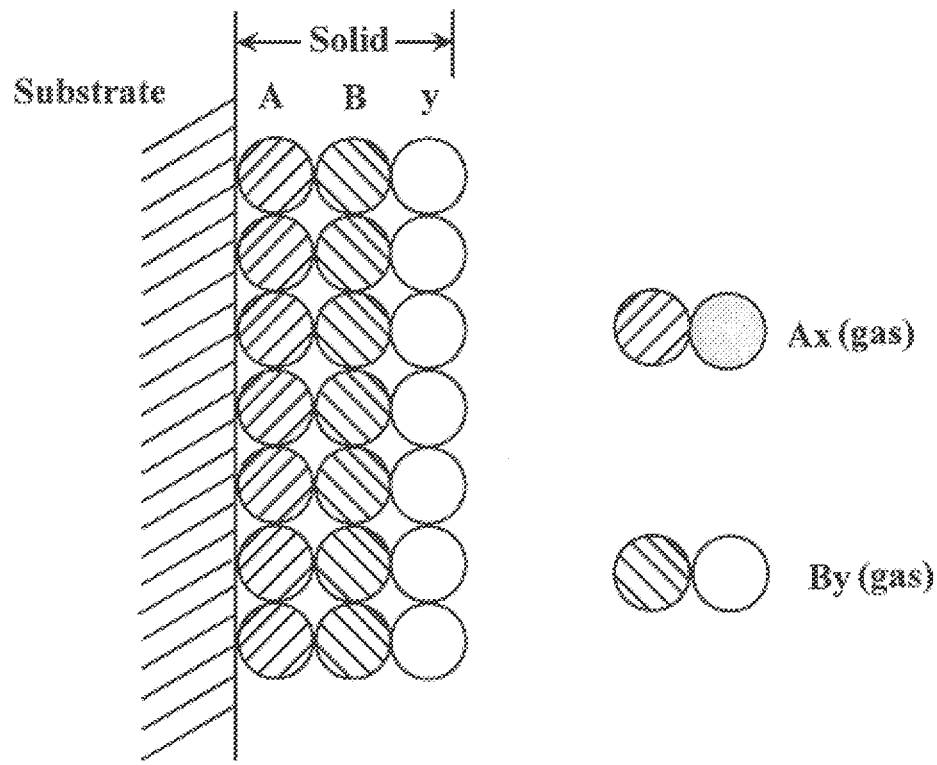
FIG. 1a is a schematic illustration of a generic atomic layer deposition process.

In contemplating commercialization of atomic layer deposition technology, batch-type ALD systems, meaning systems generally wherein substrates to be coated are arranged in different planes, and wherein relatively large numbers of substrates are coated in a single reactor simultaneously, have been seen as attractive from the point of view of throughput, but these sorts of large batch systems are seen by the present inventors to have several serious drawbacks compared to a compact low-profile system having a single gas presentation path, as taught in several embodiments below. Among these difficulties are:

(a) Gas pulsing in a batch system cannot be as rapid and as sharp as may be done in a compact single substrate system.

(b) Backside deposition is difficult to prevent in multi-substrate systems. To prevent backside deposition individual substrates need to be clamped on a dedicated heater, including such apparatus as electrostatic chucks.

(c) Plasma cleaning has been found to be ineffective in large batch systems, as compared to single substrate systems. In situ plasma cleans allow the realization of a very long time between maintenance cleaning.

(d) Gas depletion effects can be a severe process limitation in batch process reactors and are difficult to address in batch systems.

(e) Batch processors are less flexible than single substrate systems for process control, substrate-to-substrate repeatability, process variation, and maintenance. Batch processors also cannot be easily matched to relatively small footprint clustering architecture configurations.

For these and other reasons the present inventors have developed a unique approach to ALD processing comprising a low-profile compact ALD reactor (LP-CAR), which reduces both internal volume and external height, and allows for fast gas switching and enhanced process control, as well as for a unique system architecture. The unique architecture enabled comprises a vertically-stacked multi-unit system, adaptable to clustering schemes for serial integration.

In embodiments described below, the inventors teach a unique low-profile compact reactor, and unique system architectures for use of the ALD reactor in production, which addresses and solves limiting features of batch-types ALD systems.

In the unique design of the LP-CAR in embodiments of the present invention, high throughput is enhanced through fast gas switching promoted in part by minimized internal process volume of the reactor relative to the surface area presented to be coated in the reactor. While length and width of a single-substrate reactor are dictated by the maximum substrate size to be accommodated, typically at about 1.5 times the substrate diameter (if the substrate is round), the internal height of the reactor is the controlling dimension for internal volume. In embodiments of the invention herein, the inventors have also recognized an advantage of having a single, unimpeded gas presentation path to substrate surface to be coated, which generally calls for surface to be coated to presented in a common plane.

Boundary layer conditions and proper gas flow must be achieved, and it is desirable to have alternative plasma lid designs. The ALD process also requires a substrate heater in the process volume to heat substrates during processing, and additionally there are specific requirements for gas delivery and gas exhaust subsystems. Given all of these requirements, in embodiments of the present invention, a low-profile, compact ALD reactor (LP-CAR) suitable for single substrate processing is provided. In embodiments of the present invention described below, low-profile is defined as the height of a reactor as opposed to horizontal dimensions. The ratio of height of an LP-CAR to horizontal dimensions in different embodiments of the invention can vary, depending on specific system requirements. The ratio of height to horizontal dimensions, however, in embodiments to follow is typically less than 1, and can be as low as 0.2. A ratio of about 0.65 is more common for embodiments described herein.

In embodiments of the invention the LP-CARS are independently-controllable reactors, and may be used as building blocks in a unique architecture to address throughput requirements and desirable flexibility in processing sequence. LP-CARS in preferred system embodiments are vertically stacked, which promotes efficient use of precious process real estate. The vertically-stacked architecture is termed by the inventors VESCAR™ for <u>ve</u>rtically-<u>s</u>tacked <u>c</u>ompact <u>A</u>LD <u>r</u>eactor.

In some embodiments taught in enabling detail below, the VESCAR system can be a stand-alone configuration, wherein substrates are provided to and accepted from the VECAR unit through a cassette load-lock subsystem. In other embodiments one or more load locks and one or more VESCAR units are interfaced to a cluster tool handling system, which may also comprise processing subsystems other than ALD, such a CVD, PVD, cleaning, lithography, and others.

Figure 2:
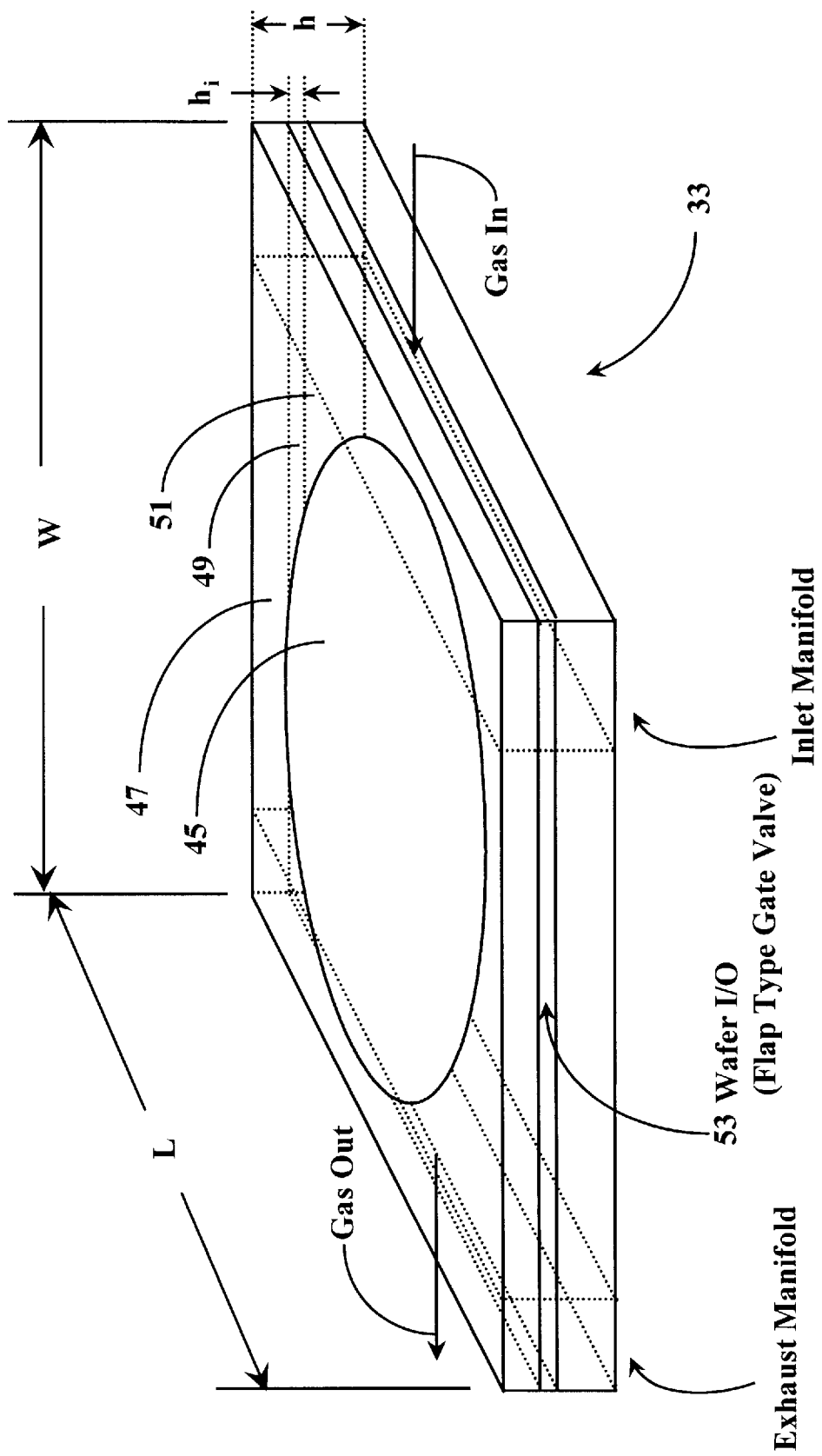
FIG. 2 is an isometric view of a low-profile compact reactor unit according to an embodiment of the present invention.

FIG. 2 is a mostly diagrammatical isometric view of a compact reactor unit 33 according to an embodiment of the present invention, having substrate surface to be coated presented in substantially a single plane, and a single gas flow path to the substrate surface. A substrate I/O (in/out) opening 53 on one side of the reactor unit in a preferred embodiment of the invention is equipped with a gate valve, as described above, and as is described more fully below.

Gas flow over a loaded substrate 45 in position to be processed is in a horizontal direction substantially parallel to the surface of substrate 45 upon which deposition is to take place, entering from one side (gas in) and exiting an opposite side (gas out). Precursors (chemical species) are alternately pulsed into reactor unit 33 followed by a gas purge, as described relative to FIG. 1*b* above. In this embodiment the gas flow is from right (gas in) to left (gas out) as represented by directional arrows in the figure. In another embodiment the gas flow may be from left to right In one embodiment the individual compact reactor has an inlet and an exhaust manifold built into the reactor body.

Compact reactor unit 33 may be constructed from any suitable material known in the art such as stainless steel, aluminum, composite graphite, or other materials deemed appropriate for sustaining an applied vacuum and providing suitable characteristics as known in the art for deposition chambers. In one embodiment, reactor unit 33 may be reinforced with structural ribs for the purpose of adding strength under vacuum. Compact reactor unit 33 in the embodiment shown has an overall height h and is of a width and depth so as to accommodate at least a single substrate for deposition. Scaling may be done for substrates of different sizes, from very small up to as much as 400 mm. Diameter or more.

The actual height of the substrate hold area 49 expressed as $h_i$, in terms of the horizontal dimensions, is a is a very important parameter, as this height helps define the internal volume of a reactor wherein gas pulsing and processing takes place. The external height is controlled to provide a low-profile to facilitate stacking of reactors, as briefly described above, in a system architecture to be described fully below. The internal height of the reaction region in an LP-CAR unit according to embodiments of the present invention is separately controlled to provide a practical minimal volume relative to substrate surface area to be coated, which maximizes gas utilization and enhances fast gas switching. In more general terms, the critical issue discovered by the present inventors is that speed of gas delivery to the surface to be coated must be maximized, while providing a sufficient quantity of precursor to assure surface saturation, and without an overabundance of gas. This is best accomplished by a reactor internal shape which promotes a uniform cross section in the wave front of advancing gas injected into the reactor, minimizes internal volume, and provides a sufficient clearance in the gas path over the surface to be coated that gas flow to the substrate surface is not impeded.

In an LP-CAR provided for a substrate diameter of 300 mm., the internal height in embodiments of the invention will preferably be about one inch, but can vary somewhat from one embodiment to another. It is preferred by the inventors that the ratio of internal height to horizontal internal dimensions of the reaction region not exceed about 0.25, to insure fast gas switching and efficient precursor utilization.

Retractable substrate lift pins (not shown) in some embodiments are positioned in the bottom surface of substrate hold area 49 for the purpose of supporting the substrate. The number of substrate-lift pins present in substrate hold area 49 is typically three or more and the pins are arranged in a pattern to support the substrate horizontally.

Substrate-lift pins are commonly used for horizontal support of a substrate in a reactor chambers in processes such as RTCVD. In some embodiments, substrate-lift pins are part of a substrate holding tray. In other embodiments, substrate-lift pins are built in to the reactor chamber. Typically, substrate-lift pins come to a point at the substrate surface for the purpose of providing a small heat-sink area and to avoid surface coating anomalies. This rule is more critical in processes that use more heat such as RTCVD, and or in cases where a substrate is processed on both surfaces simultaneously. In some embodiments a flat electrostatic chuck (ESC) with suitable heat capabilities may be used to secure substrates during processing, precluding backside deposition.

Compact reactor unit 33 is heated and cooled during substrate processing. Area 51 represents a heater compartment wherein a heating device such as a resistance-heated coil is housed. Area 47 comprises cooling lines running through the top surface of reactor unit 33. It will be apparent to one with skill in the art that differing chemical species or precursors that are used in various processes may require different temperatures to be maintained inside compact reactor unit 33 during process. Therefore it is intended by the inventors that various heating and cooling methods known in the art of deposition be applicable in various embodiments of the present invention. Similarly, area 51 may house more than one type of heating element as may be required for delivering levels of heat in differing measures of time, as may be required, for example, to do in-situ annealing, and so on.

Figure 3A:
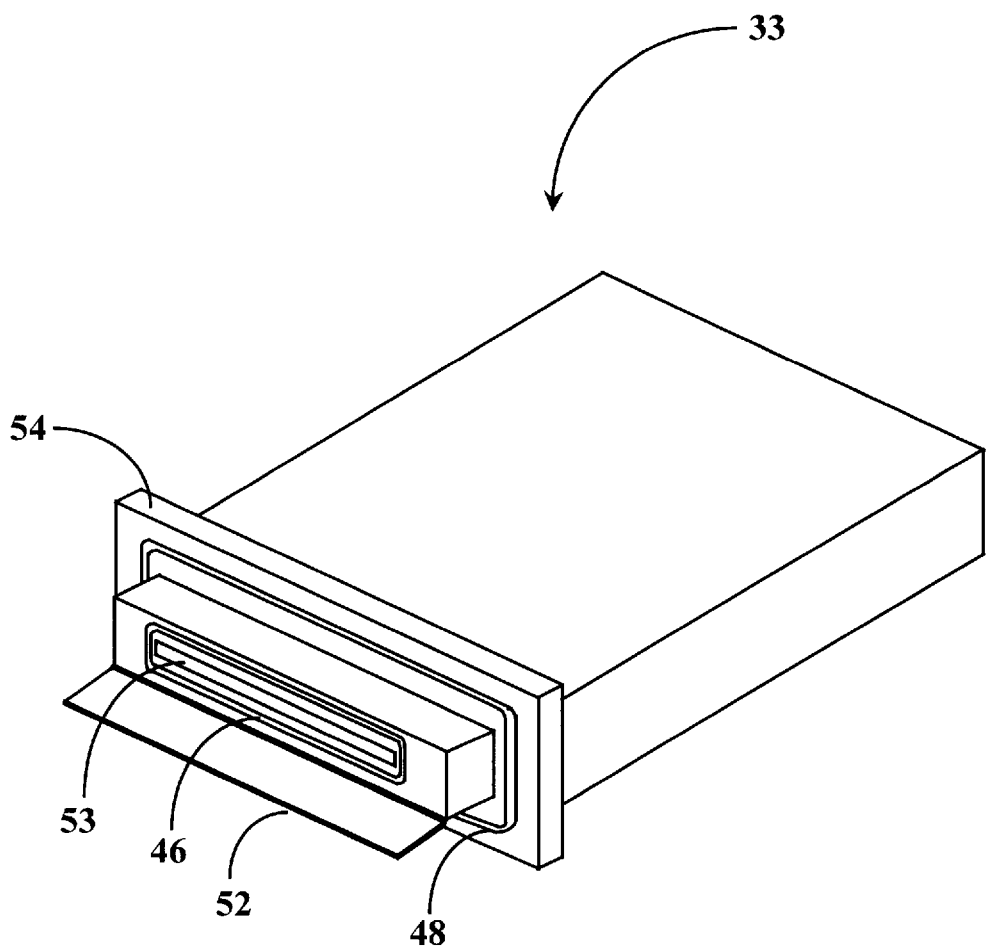
FIG. 3a is an isometric view of the compact reactor unit of FIG. 1 showing a flap-type gate valve and flange according to an embodiment of the present invention.

FIG. 3*a* is a simplified isometric view of the compact reactor unit 33 of FIG. 2 according to an embodiment of the present invention wherein a flap-type remotely-operable valve 52 is provided to cover and expose opening 53. This valve is closed for processing and open for substrate transfer to and from the LP-CAR. There is in this embodiment a vacuum seal 46 surrounding opening 53, which may be an o-ring in some embodiments, a quad-ring, a metal seal, or other vacuum seal as known in the art. Valve 52 is provided to close against the vacuum seal to isolate the unit in operation. A flange 54 in one embodiment is positioned behind gate valve 52 and also has a vacuum seal 48 provided for sealing against a non-vacuum side of an interface wall of a vacuum chamber in a production architecture to be described in further detail below.

There are various methods that are known in the art for automatic control of gate valves, such as valve 52. In a preferred embodiment of the present invention the gate is a flap-type valve, and a cam-operated electrical mechanism (not shown) is provided and mounted to a wall of reactor unit 33 and also to a pivot arm (not shown) on the valve door. Electrical leads pass through the body of reactor 33 from the non-vacuum side in operation. A variety of mounting schemes may be implemented for mounting a cam-type device for opening and closing gate valve 52 without departing from the spirit and scope of the present invention. Electrically-operated cam devices are common and known in the art as well as to the inventors.

The embodiment represented here is but one example of how LP-CAR 33 may be provided with a gate valve for the I/O opening. In another embodiment a flap-type door may be provided pivoted from above rather than from below. In yet another embodiment, instead of a flap-type door, a cam-operated sliding door may be incorporated. In a preferred embodiment, a flap-type door is used because of simplicity of design and implementation.

It will be apparent to one with skill in the art that the actual shape of flange 54 as well as gate valve 52 may vary considerably without departing from the spirit and scope of the present invention. For example, flange 54 may be of the form of a rounded rectangle or perhaps an elliptical shape. Similarly, gate valve 52 may take other forms than those described above. In some embodiments a sealing interface may be provided without using a flange as an integral part of the reactor body.

Figure 3B:
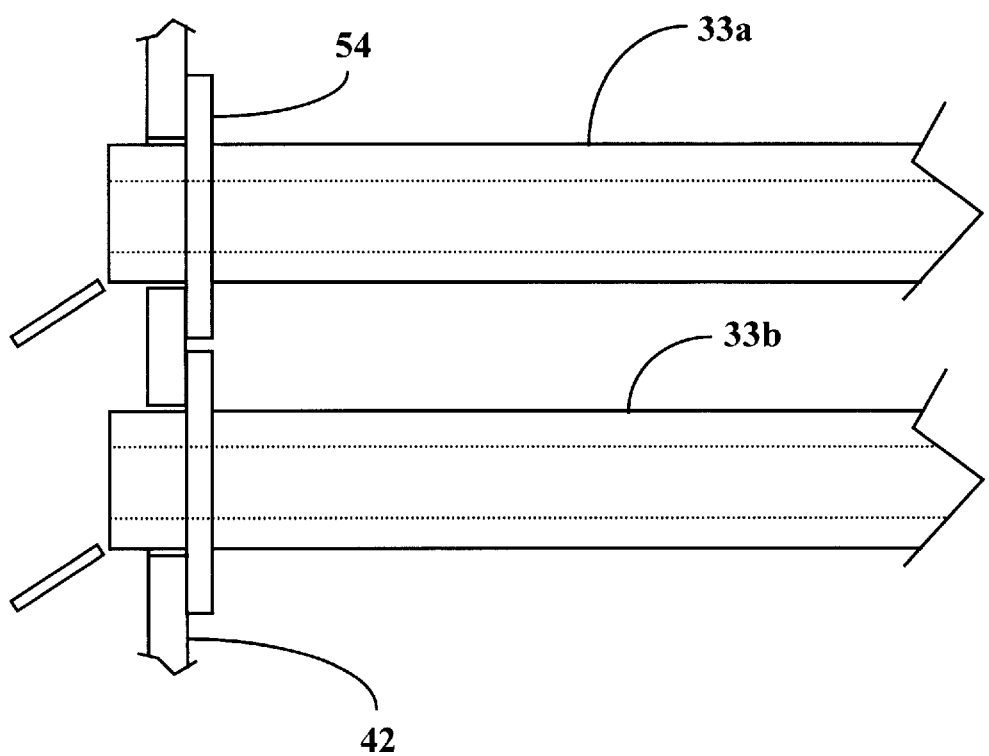
FIG. 3b is a right side view of two compact reactor units as shown in FIG. 1 according to an embodiment of the present invention.

FIG. 3b is a side elevation view of two compact reactor units as described in FIG. 3a according to an embodiment of the present invention, illustrating a vacuum interface that is formed with flange 54 and an interfacing wall 42 of a vacuum chamber. On the non-vacuum side a stacking fixture or rack (not shown in FIG. 3b) is used to support reactor units 33a and 33b and other reactor units not shown in FIG. 3b that may be a part of a VESCAR system according to embodiments of the present invention. It will be apparent to one with skill in the art that a stacking fixture or rack used for supporting and spacing reactor units in a vertical configuration may be constructed from any durable material such as stainless steel, or any other suitable material as long as it can support the individual reactor units and resist dimensional changes that may occur. Fixtures used for positioning one or more components to be interfaced to a shared interface in a system are relatively common and known by persons skilled in the art. The important characteristics for a stacking fixture as in this embodiment of the present invention are that it can equally and accurately space the reactor units, facilitating successful and repeatable transfers of to substrates, and that it can support the weight. In one embodiment a fixture in the form of a rack having removable spacers for proper positioning could be used. In another embodiment, accurate spacing may be accomplished via adjusting screws and the like.

In various embodiments spacing of the LP-CAR units in a vertical stack must allow for providing thermal isolation between the lower hot region of each reactor and the upper cool region of each adjacent reactor. Similarly, the topmost and the lowermost LP-CAR in a stack should have a similar thermal environment to the other reactors in a stack.

The area to the left of chamber wall 42 shown in FIG. 3b is the vacuum region of a vacuum transfer chamber in a vertically-stacked system described below. Securing flange 54 to the chamber wall can be accomplished by conventional fastening techniques and hardware, such as socket-head screws. In an alternative embodiment, a mating flange may be affixed to the chamber wall, perhaps via welding, so that flange 54 could be clamped to the mating flange thereby completing the interface. In such a case the mating flange may have alignment pins that fit into openings present in flange 54. It will be apparent to one with skill in the art that there are many configurations possible only some of which are described herein.

Figure 4:
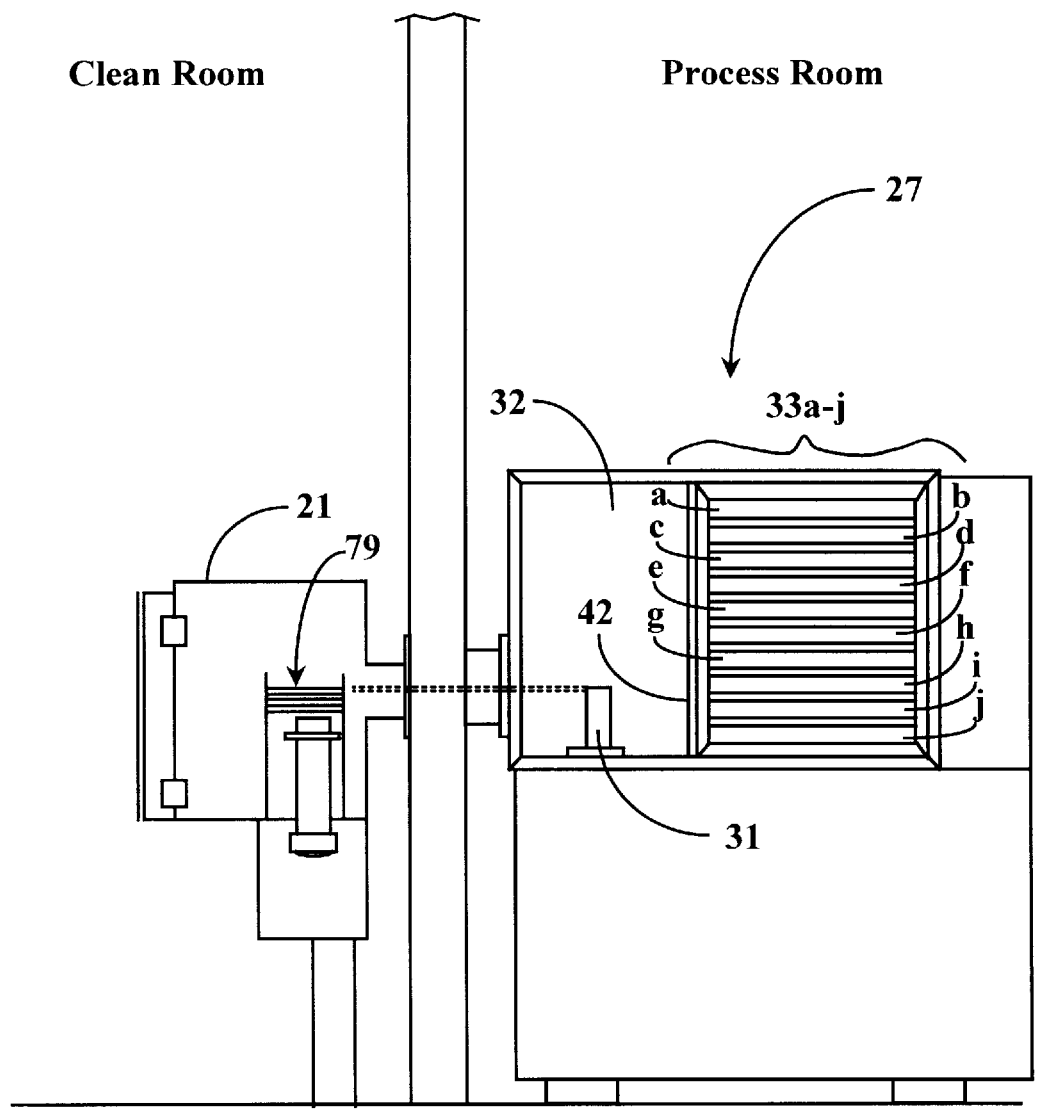
FIG. 4 is an elevation view of VESCAR 27 integrated with a load-lock according to yet another embodiment of the present invention.

FIG. 4 is an elevation view of a VESCAR system 27 interfaced directly to a cassette load lock 21 in a production system embodiment of the present invention. In this embodiment, pre-processed substrates are loaded into cassette load lock. In this architecture a wall separating a clean room environment from a process room has an opening through which cassette load lock 21 and VESCAR unit 27 are interfaced. This sort of clean room interfacing is well-known in the art for production systems, to conserve precious clean room space.

VESCAR system 27 comprises a vacuum handling chamber 32 with wall 42 (see also FIG. 3b) and a Z-axis robot 31 with horizontal as well as vertical extension capabilities, and is shown here extending into cassette load lock 21. A cassette 79 loaded with preprocessed substrates is positioned so that Z-axis robot 31 can pick up a substrate and move the substrate into VESCAR unit 27. Once inside VESCAR 27, Z-axis robot 31 rotates 180 degrees extends to the proper vertical position for placement of a substrate into a reactor unit, of which 33(a–j) are shown in a vertically stacked architecture interfaced to vacuum wall 42.

Ten LP-CAR units, one-above-another as shown in FIG. 4 is considered by the inventors a practical number to address throughput needs while at the same time conserving real estate. In some embodiments of the present invention there are more than one extension and transfer arm associated with Z-axis robot 31, and/or more than one end effector to avoid any transfer limitations on throughput. Finished substrates are unloaded in reverse order to the loading process described, and the finished substrates are placed back in cassette 79.

The VESCAR architecture of FIG. 4 is a minimum-cost solution, and a starting point for further integration into more sophisticated VESCAR architectures. Also, the architecture shown is a good process research and development configuration for use in developing process sequences and the like using multiple LP-CAR units. Processes developed in the VESCAR system of FIG. 4 may be scaled up to more sophisticated processing schemes to be described below.

Figure 5:
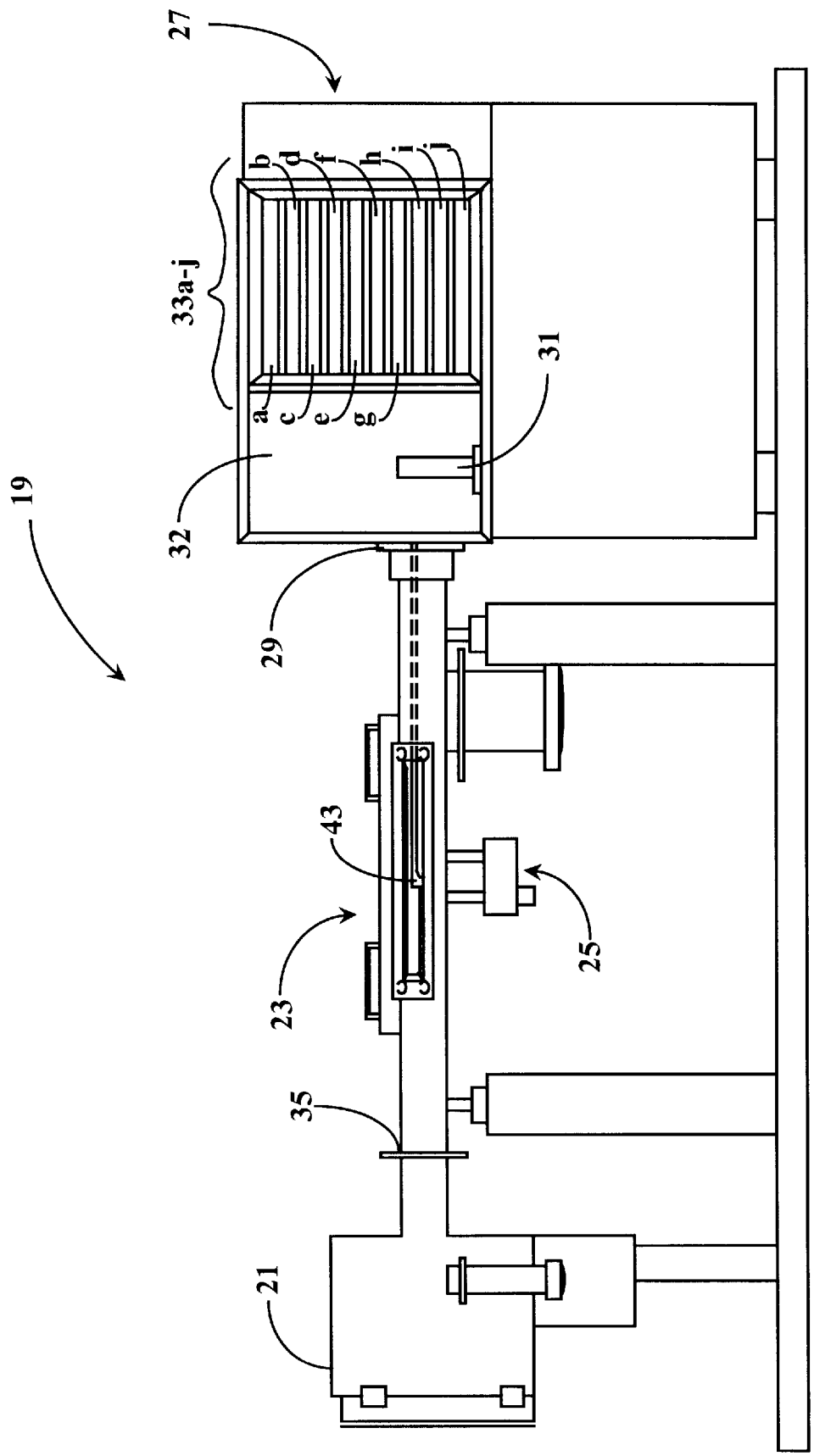
FIG. 5 is an elevation view of an ALD vertically-stacked system architecture according to an embodiment of the present invention.

FIG. 5 is an elevation view of an ALD production system 19 according to an embodiment of the present invention. The unique combination and automation of various components described herein effectively surmount obstacles related to system architectures available with more conventional ALD reactors. Embodiments described and taught below provide substantive solutions to problems such as slow deposition rate, use of scarce production space, and other problems faced with current ALD applications and competing processes.

Referring now to FIG. 5, a (VESCAR) 27 comprises a vacuum chamber 32 having a vertical interface for the attachment of separate compact reactor units 33a–j, as also described above with reference to FIG. 4. Compact reactor units 33a–j are adapted to sustain suitable vacuum both separately and in integration with vacuum chamber 32. A flap-type gate valve present in each compact reactor unit 33a–j allows for separate pump-down (gate closed) and sharing vacuum in vacuum chamber 32 (gate open). Individual provision at each reactor unit allows for vacuum, purge, and flow of process gases, and suitable valving , including the load and unload flap-type valve described above, allows substrates to be transferred to and from the vertically-stacked reactors to and from chamber 32.

It will also be apparent to one with skill in the art that there may be more or fewer compact reactor units stacked vertically and present in VESCAR 27 than the number shown in FIGS. 4 and 5 without departing from the spirit and scope of the invention. In the embodiment described here with reference to FIG. 5 , there are 10 compact reactor units 33a–j , however, in actual practice of the present invention, as many compact reactor units may be incorporated into VESCAR 27 as may be deemed appropriate for facilitating a high throughput in a competitive manner with respect to known commercial processes. The number is limited as a practical matter by vertical space available, and must be matched by the range of handling equipment dedicated to the purpose.

Z-axis robot 31 is provided in chamber 32 for the automated loading and unloading of substrates with respect to compact reactor units 33a–j, and for interfacing with other material-handling equipment. Z-axis robot 31 can extend to vertical and horizontal positions and is programmed to interface with each compact reactor unit 33a–j. Z-axis robot 31 can also be programmed in this embodiment to load substrates to reactors in any sequence desired. For example, substrates can be loaded from bottom to top, from top to bottom, from middle to top, and so on. Further, substrates can be unloaded from one compact reactor unit and reloaded to another compact reactor unit. Any sequence is possible. In some embodiments there are multiple substrate handling devices, such as end-effectors and the like, associated with a single Z-axis robot.

Compact reactor units 33a–j are interfaced to chamber 32 along one wall of the chamber, and carefully spaced to allow for error-free loading and unloading by the Z-axis robot. The reactors interface to the chamber with a vacuum seal, and are supported by a rack assembly outside chamber 32, as is illustrated below in additional detail with reference to further drawing figures.

Figure 1B:
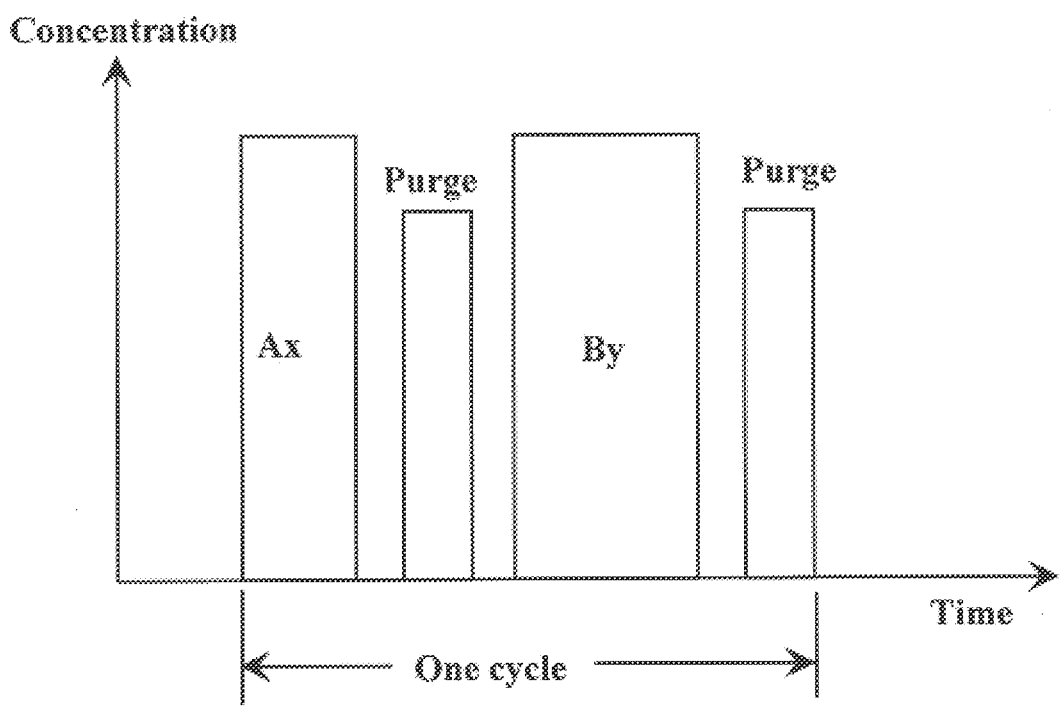
FIG. 1b is a typical timing diagram for ALD gas pulsing.

In this embodiment a vacuum central robotic substrate handler 23 is interfaced with VESCAR 27 via a gate valve 29. Gate valve 29 is a vacuum valve that allows VESCAR unit 27 to be isolated from the cluster-tool handler between substrate transfers. A transfer mechanism 43 operated through a rotary mechanism 25 loads and unloads substrates to and from Z-axis robot 31. Transfer mechanism 43 in FIG. 1 is shown extended to gate valve 29. In a position 180 degrees from the position shown, transfer mechanism 43 can extend to a cassette load lock 21 where preprocessed substrates are loaded and finished substrates are unloaded. Robotic substrate handling systems of the sort depicted by handler 23 are commercially available from several vendors; among them Brooks Automation, Equipe, and Smart Machines.

In a preferred embodiment of the present invention, preprocessed substrates are first placed into cassette load lock 21 in a vertically oriented cassette or rack (not shown). After the preprocessed substrates are presented in cassette load lock 21, the lock is closed and evacuated to a specified vacuum through a vacuum port (not shown). The transfer volume within robotic handler 23 is also evacuated to a specified vacuum through a vacuum port also not shown. Vacuum chamber 32 is pumped down through a similar vacuum port (not shown). With all units suitable pumped, a gate valve 35 opens to allow transfer mechanism 43 to extend into cassette load lock 21 to retrieve substrates one-at-a-time. A cassette handler (not shown) in cassette load lock 21 can raise or lower a platform which holds a vertical cassette holding the preprocessed substrates.

When transfer mechanism 43 retrieves a substrate, it then retracts to within the robotic handler volume and rotates to a 180 degree position so that it may extend to VESCAR 27. Typically gate 35 closes between transfers, but this is not strictly required in many process-flow schemes. With the transfer mechanism at VESCAR 27, gate valve 29 opens to allow transfer mechanism 43 to pass the substrate through to Z-axis robot 31. Z-axis robot 31 then receives and loads the substrate into one or another of the vertically-stacked compact reactor units, and so on.

Many operating schemes are possible. In the architecture shown one preferred scheme is to adapt the system with an equal number of compact ALD reactors as positions in a load-unload cassette 21. Transfer continues until all substrates from load lock 21 are transferred to reactor units (all reactor units then having each a substrate to be coated), then intervening valves close, and processing commences in reactor units 33a–j. This system has the processing steps of a batch system while all substrates are processed in individually-isolated reactor units.

Many other schemes are possible. Because each compact reactor has an isolation gate valve, in some schemes reactor processing commences as soon as a substrate is loaded. Other process flow schemes will be apparent to those with skill in the art.

In one embodiment, as individual pumping and isolation is provided for chamber 32, at the time that reactors are loaded and before processing begins in the reactor units, pressure is increased in chamber 32, by bleeding in an inert gas, to a level sufficient to provide a pressure differential across the flap-type valves of the individual reactors, proving additional sealing force to the individual reactor valves than would otherwise be possible.

After all of the processes have been performed in compact reactor units 33a–j, flap type gate valves (FIG. 3a element 52) installed in each unit can be opened to allow substrates to be unloaded in a reverse process from that described above with reference to loading. One by one, finished substrates are returned typically to the same cassette from whence the substrates were retrieved. Lock 21 may then be vented with valve 35 closed, and a cassette load of finished substrates may be removed. This processing is wholly automated from the point of leaving the preprocessed substrates in cassette load lock 21 to picking up the finished substrates in cassette load lock 21. Timing features related to gate valve opening, speed of delivery, length of process or processes (including sequence of processes), pump down sequences, and other required commands are programmable functions of controlling software and hardware according to techniques generally known in the art.

Due in part to the flux-independent nature of the ALD process, wherein layers are formed on the deposition surface by chemisorption as described above, and as is known in the art, compact reactor units such as compact reactor units 33a–j can be designed so as to have a width that will receive substrates of optimum size such as 300 mm substrates. Also, smaller substrates could be processed in the same system without scaling down the size of compact reactor units 33a–j. In another embodiment, a scaled-down system could be implemented for the purpose of processing smaller substrates one-at-a-time, or a scaled-up version could be provided for other products such as flat panel displays and so on.

Figure 6:
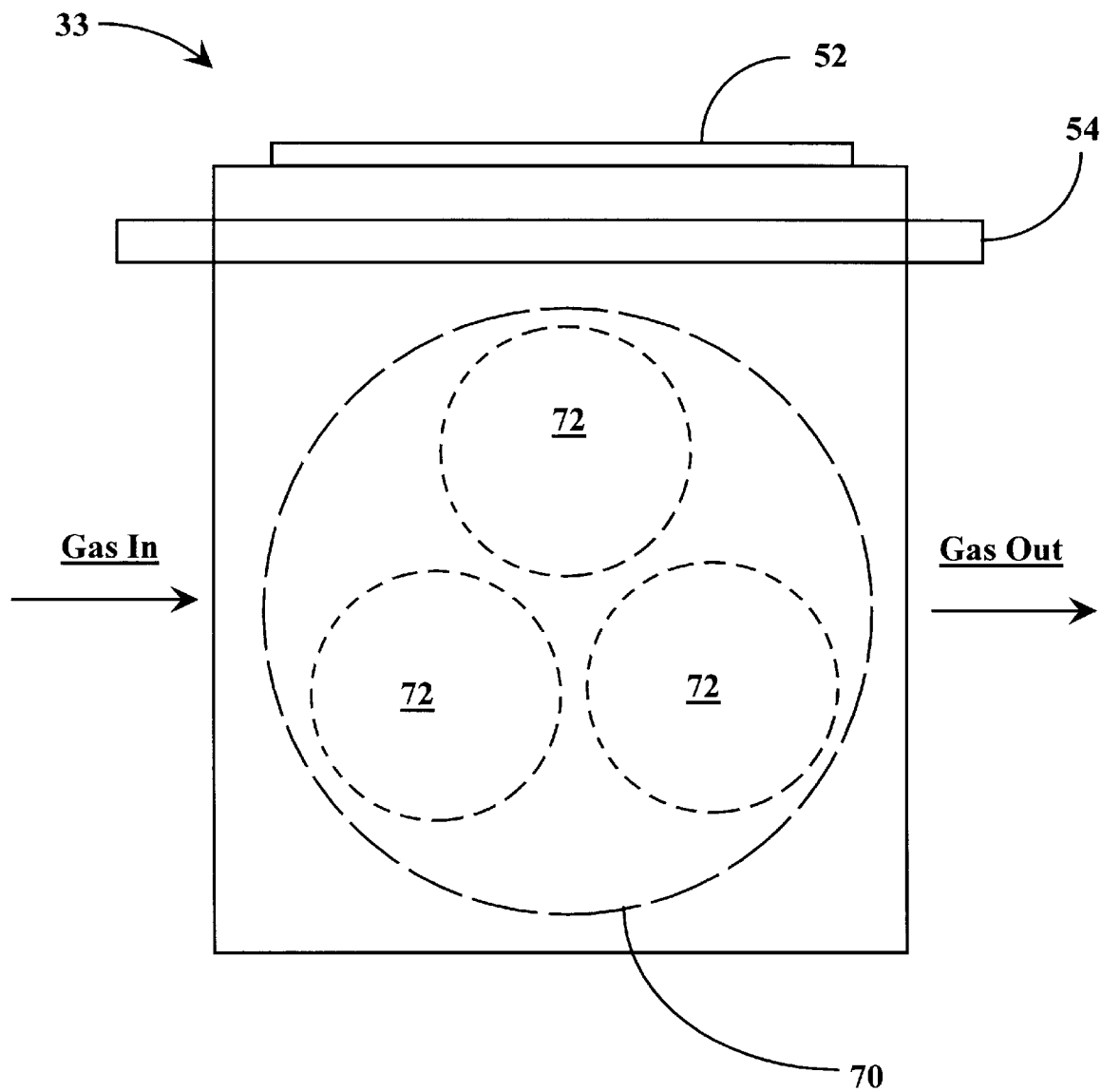
FIG. 6 is a plan view of an LP-CAR according to an embodiment of the present invention adapted for processing multiple substrates in a single LP-CAR unit.

In some embodiments of the present invention, an LP-CAR developed for a particular substrate size, as mentioned in the paragraph just above, may be adapted for processing multiple substrates of smaller size. FIG. 6 is a plan view of an LP-CAR 33 of the type shown in FIG. 3a with the nominal substrate size shown as a dotted circle 70. An LP-CAR unit in alternative embodiments of the invention may be adapted to process, for example, three substrates 72 smaller than substrate 70 in LP-CAR unit 33. In some embodiments unit 33 may be provided with a rotary chuck so substrates 72 may be placed and retrieved at a common transfer point. In other embodiments the robotic transfer devices may be adapted to place the substrates at the desired locations on a hearth. In yet other embodiments multiple substrates may be handled in a common carrier transferred to and from an LP-CAR unit. This allows for use of the single-substrate LP-CAR design with multiple substrates in the same process plane.

The unique architecture described above provides a wholly automated commercial ALD process not previously available with current art. By utilizing VESCAR 27, a high process throughput can be accomplished comparable to throughput provided with competing technologies such as CVD, PECVD, and the like. Also, because of the inherent uniformity improvements attainable through the ALD process, and the fact that separate reactor units are used in place of batch technology, higher yields can be realized without the problems associated with cross contamination and the like. And in achieving these advantages, scarce production floor space is used very conservatively, due to the vertical stacking of compact units.

The embodiment described with the aid of FIG. 5 represents but one example of many possible arrangements of equipment that could be utilized with VESCAR 27. While there is only one cassette load lock 21 and one VESCAR 27 shown in this embodiment, there are two additional positions on robotic handler 23 to which additional load locks or VESCAR units may added. Further detail regarding the addition of equipment as described above will be provided in an additional embodiments below.

Figure 7:
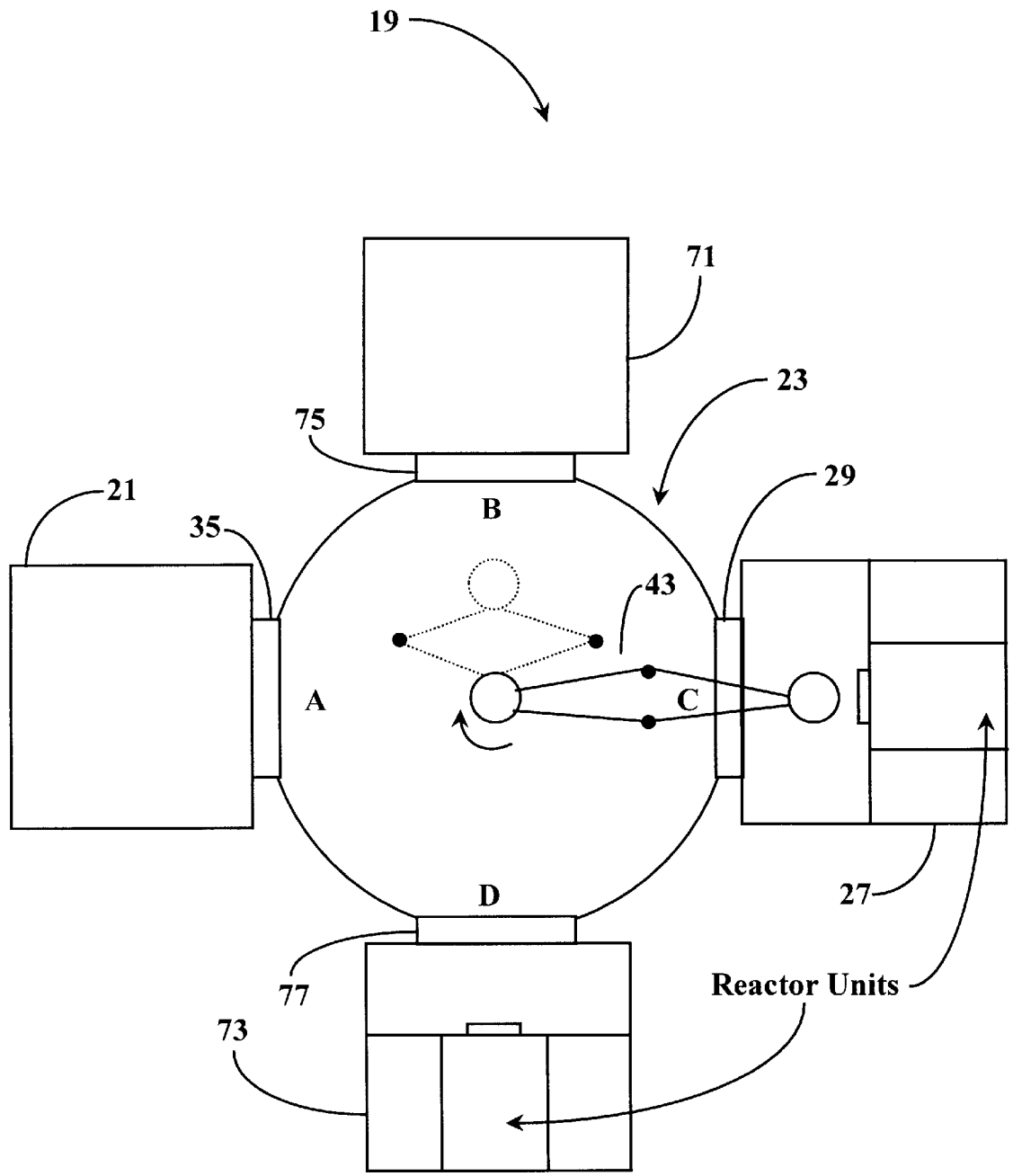
FIG. 7 is a top view of production system 19 according to an alternate embodiment of the present invention.

FIG. 7 is a top view of production system 19 of FIG. 5 according to an alternative embodiment of the present invention wherein additional VESCAR units or cassette load locks may be interfaced with robotic handler 23 for the purpose of running additional processes, such as CVD, cleaning, and the like. Robotic handler 23 has four 90 degree positions illustrated as positions A, B, C, and D in FIG. 7. Position A is connected to gate valve 35 and cassette load lock 21 also described with reference to FIG. 5. Position B is connected to a gate valve 75 and a cassette load lock 71. Position C is connected to gate valve 29 and VESCAR unit 27 also described with reference to FIG. 1. Position D is connected to a gate valve 77 and a second VESCAR unit 73. Transfer mechanism 43 is controlled by operating unit 25 of FIG. 5 whereby transfer mechanism 43 is rotated to achieve each position. In FIG. 7 mechanism 43 is shown extended at position C with a loaded substrate in a position to be received in VESCAR unit 27. Gate valve 29 is in open position allowing transfer of the substrate. Transfer mechanism 43 is also shown in a retracted position (illustrated by dotted lines) and oriented to gate valve 75 and cassette load lock 71 in position B. In this example the transfer mechanism has taken a substrate from cassette load lock 71 and placed it in VESCAR unit 27. Transfer mechanism 43 operates in a like fashion with respect to all four positions illustrated in that extension, retraction, rotation and extension are performed in order to successfully transfer substrates from load locks to VESCAR units and back to load locks.

In one embodiment, three VESCAR units and one cassette load lock may be utilized wherein different parallel processes (all reactor units in one process module dedicated to one process) are being performed in each process module. Similarly, serial processing (each reactor unit in one process module dedicated to a different process) can also be performed. In another embodiment, one process module may be dedicated to serial processing whereas another process module is dedicated to parallel processing with the system incorporating two cassette load locks. It will be apparent to one with skill in the art that there are many processing configurations that could be utilized in production system 19 without departing from the spirit and scope of the present invention several of which have already been described above.

Figure 8:
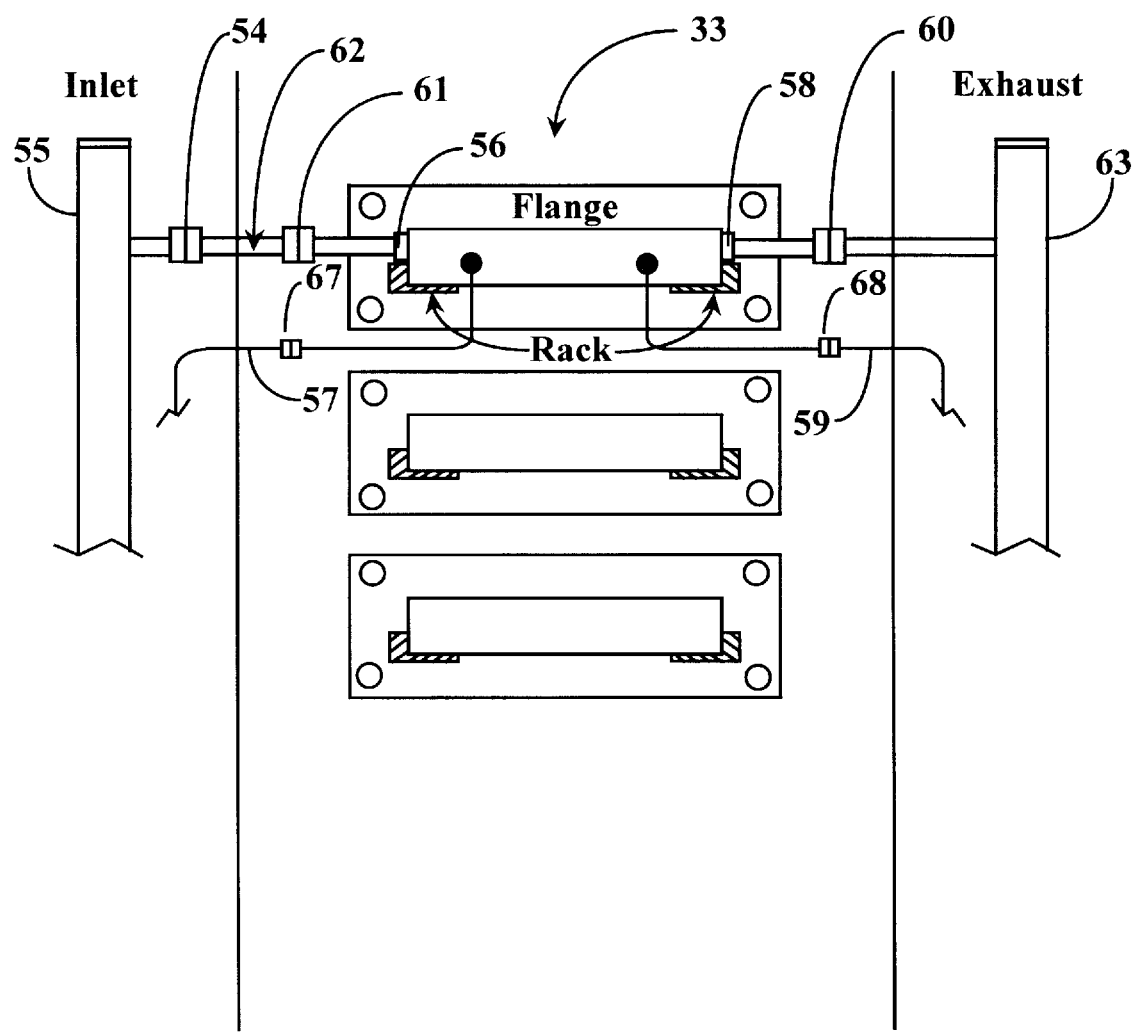
FIG. 8 is an elevation view of the stacked compact reactor unit of FIG. 7 viewed from the rear according to an embodiment of the present invention.

FIG. 8 is a rear view of VESCAR system 27 showing three of the ten vertically stacked reactor units interfaced to chamber wall 42 according to an embodiment of the present invention. A vertically-oriented gas inlet manifold 55 is shown on one side of the vertically-stacked reactor units for providing a gas or vapor material to the reactors. In a preferred embodiment of the present invention, multiple precursors and inert gases may be alternately pulsed into reactor unit 33 during processing, but only one manifold 55 is shown in this figure to avoid confusion in the drawing. In actual practice of the present invention one manifold is used for each precursor gas or vapor and at least one for purge gas. Therefore, a minimum of three manifolds would typically be used.

In a preferred embodiment of the invention a valved charge tube is used to control quantity of supply to each reactor for each gas or vapor provided. In FIG. 8 one such charge tube 62 is shown. These separate charge tubes are of a predetermined volume and are charged with gas or vapor of controlled pressure and temperature so the number of molecules of gas or vapor is known. Each charge tube is isolated by two valves, which, in the case of tube 62 are charge valve 54, and injection valve 61. Upon opening injection valve 61, the charged content of that section of tubing is discharged into reactor unit 33. Opening charge valve 54 with injection valve 61 closed allows the charge tube to be filled with a precursor gas, vapor, or purge gas at a predetermined pressure and temperature.

A quick-connect flange 56 is used to connect the gas and precursor source to reactor unit 33, and other quick connects may be provided to allow for relatively quick release of all gas and vapor lines to and from each reactor unit. The pulsing of precursors and gas purging is done in a sequential manner as required for an ALD sequence. The time of individual pulses is typically very short (approximately 50 to 300 milliseconds depending on the process), and pulses are typically separated by a short transition time. For this reason valves of a fast switching nature are incorporated. Fast switching valves are well known in the art and to the inventors.

A vertically-oriented vacuum exhaust manifold 63 is connected to the right side of reactor unit 33 in this embodiment via a quick connect fitting 58 for the purpose of exhausting gases and vapors from the reactor chambers. The use of quick connects is meant to facilitate removal and service of individual reactors. Quick connects, as such, are known in the art and are available in a variety of shapes and configurations. A vacuum shut off valve 60 is provided for facilitating repair or replacement. This valve will be typically open during gas pulsing.

Power is provided to reactor units 33 via representative electrical lines 57. Power is provided for powering various elements such as gate valve 52 of FIG. 3B, heating sources and the like. Control signals are provided for such as valves and are provided via representative control lines 59. Electrical connectors 67 and 68 are provided in electrical lines such as lines 57 and 59 for the purpose of facilitating quick removal of reactor unit 33.

As described with reference to FIG. 2, substrates typically must be heated during processing and cooled after processing. Therefore, connections are also provided for liquid cooling. Cooling systems that recycle coolant are common in cooling reactors. Such systems are known in the art and to the inventors.

A heat source is built into reactor 33, and in embodiments of the present invention the heater is constrained in height to accommodate unique overall low-profile requirements for the LP-CAR unit.

In a preferred embodiment of the present invention, one vacuum pump can pump down all or any number of compact reactor units 33. This is accomplished with a vacuum interface installed between the vacuum pump and reactor units to which all vacuum lines leading from reactor units are connected. At each connection, a valve is presented that can open and close per programmed instruction so that any combination of reactor units can be pumped down simultaneously or separately. In a preferred embodiment, one or more reactor units could be brought to ambient Nitrogen or air, and isolated by closing valves 60 and 61, leaving other units under vacuum and so on.

In a preferred embodiment of the present invention individual compact reactor units can be easily removed from the interfacing wall of vacuum chamber 32 of FIG. 5 by disconnecting quick connects, unplugging electrical wires, uncoupling flange 54 from the interfacing chamber wall, and removing reactor unit 33 from the stacking fixture or rack used for positioning and support. A flange plug (solid flange with o-ring) in some instances is provided to be bolted or clamped to a chamber wall or mating flange so that a number of reactor units might be removed for maintenance and so on without requiring a complete shut down of the system or replacement with other LP-CAR units.

It will be apparent to one with skill in the art that there are a number of quick connects that could be used to facilitate easy removal of a reactor unit without departing from the spirit and scope of the present invention. These methods and such hardware are known in the art and to the inventors.

Figure 9:
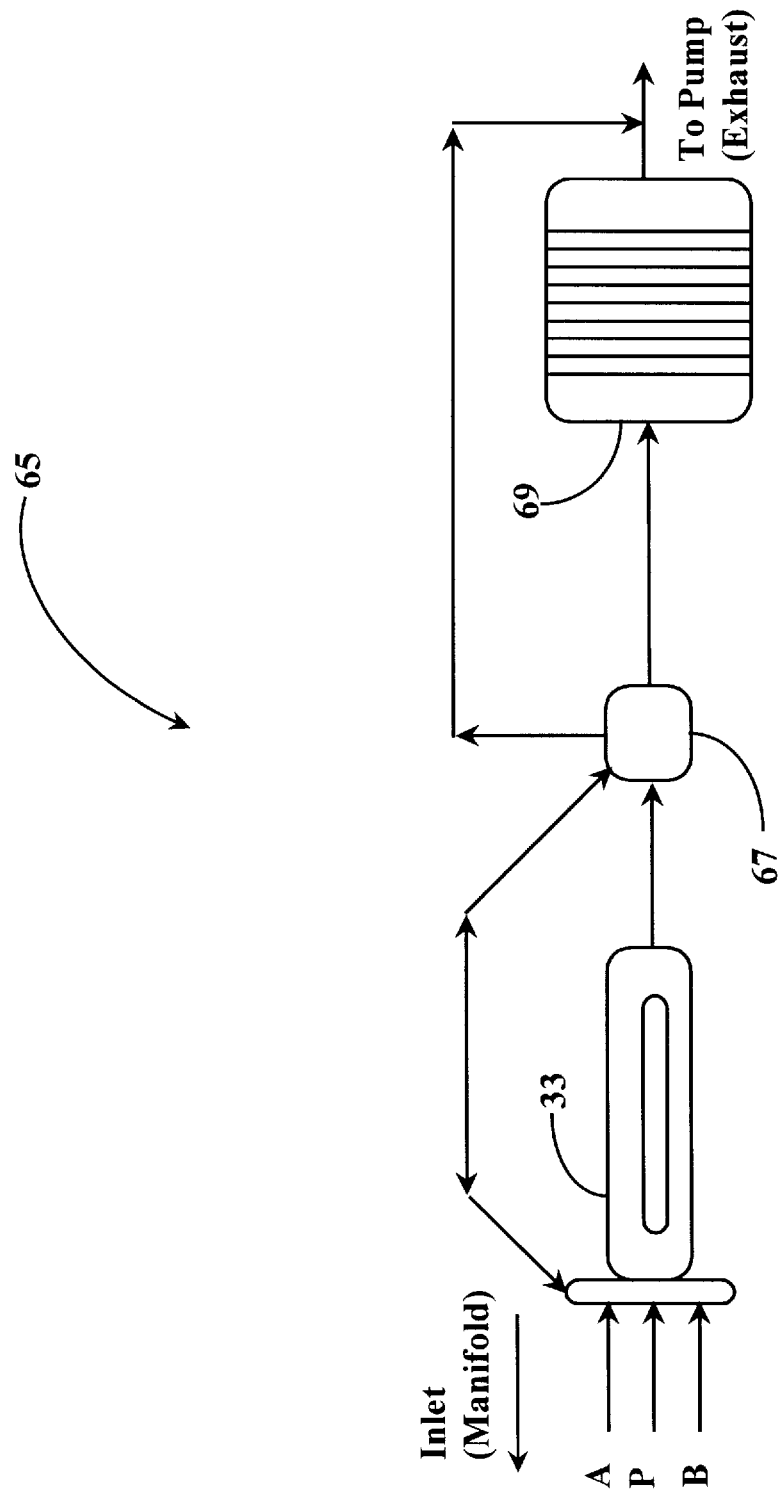
FIG. 9 is a diagram of a gas recycling and precursor trapping system according to an embodiment of the present invention.

FIG. 9 is a diagram of a gas recycling and precursor trapping system according to an embodiment of the present invention, wherein gas can be recycled and harmful byproducts can be trapped for disposal. Because precursors and gas purges are separately pulsed into compact reactor units 33 as described above, it follows that precursors or byproducts may be collected and trapped separately. Recycling and trapping system 65 is installed on the exhaust side of each reactor with a closed loop control connecting a three way fast-switching pneumatic valve with gas inlet manifold 55 of FIG. 4 so that purge gas P may be recycled back into reactor unit 33. Chemical species, represented by A and B, can be trapped separately in a precursor trap 69 (i.e. A cryo-trap) that can be removed for the purpose of disposing of harmful elements. Non-hazardous gases or chemicals may bypass precursor trap 69 and be pumped out by the exhaust pump. The innovative approach described and taught herein enables the usage of gas to be reduced and provides a more environmentally friendly process.

It will be apparent to the skilled artisan that in the case of serial processing, each reactor would have a trap system such as trap system 65 as described above. However, with parallel processing, where the same process is being performed in each reactor, then one trap system may be utilized on the exhaust side.

It will be apparent to one with skill in the art that a production system such as production system 19 of FIG. 5 may be utilized and integrated with a variety of technologies without departing from the spirit and scope of the present invention. For example, VESCAR unit 27 may share the robotic handler's platform interface with a CVD system, a cleaning module, a lithography unit, or other process unit known in the art. It will also be apparent to one with skill in the art that because of the uniformity characteristics inherent with the ALD process through chemisorption, there are no substrate size limitations or reactor number limitations. Therefore VESCAR unit 27 may be designed for optimum commercial application with respect to other competing technologies. There are many other configuration and application embodiments that are possible, many of which have already been described.

Because of the many alterations that may be made to apparatus and methods described herein, without departing from the spirit and scope of the present invention, it is intended that the scope of the invention be limited only by the breadth of the claims which follow.

What is claimed is:

1. A low-profile, compact, atomic layer deposition reactor (LP-CAR), comprising:
   a body having a length, a width, and a height, the height equal to or less than either the width or length, wherein the length and height define first and second sides opposite one another, and the width and height define first and second ends opposite one another;
   a substrate processing region within the body, adapted to enclose a substrate during processing;
   a load/unload port in the first side, the load/unload port opening to the substrate processing region and adapted for passing a substrate into and out of the substrate processing region;
   a retractable support pedestal extendable into the substrate processing region in the direction of the height, for supporting a substrate during processing;
   a remotely-operable vacuum valve connected to the first side, the vacuum valve adapted to open and close the load/unload opening executing a vacuum seal in the closed position;
   an inlet adapted for injecting a gas or vapor at the first end; and
   an exhaust exit adapted for evacuating gas and vapor at the second end.

2. The LP-CAR of claim 1 wherein the body height is no more than two-thirds of the larger of the length and width.

3. The ILP-CAR of claim 1 further comprising a heater adapted for heating a substrate supported on the support pedestal and cooling lines for passing coolant through a portion of the body.

4. The LP-CAR of claim 1 wherein the gas inlet comprises one or more valved charge tubes for injecting one of a gas or vapor into the substrate processing region, the charge tube comprising a volume closed at one end by a remotely operable charge valve and at the other end by a remotely operable injection valve, the end having the injection valve being connected to the gas inlet, such that with the injection valve closed and the charge valve open to a source of gas or vapor under pressure the charge tube may be charged with a specific mass of the gas or vapor, and with the charge valve closed and the injection valve open the specific mass of gas or vapor may be expended into the substrate processing region.

5. The LP-CAR of claim 4 further comprising a vacuum exhaust system connected to the exhaust exit.

6. The LP-CAR of claim 4 comprising two or more charge tubes adapted to be connected to separate gas and vapor sources.

7. The LP-CAR of claim 1 further comprising a vacuum seal interface for applying the first side of the reactor through a wall of a vacuum chamber such that the load/unload port is in the vacuum chamber and the balance of the compact reactor is outside the vacuum chamber.

8. The LP-CAR of claim 1 wherein, in the substrate processing region has a vertical extent and an horizontal extent, and wherein the vertical extent is no more than one-fourth of the horizontal extent.

9. The LP-CAR of claim 8 adapted for processing a single substrate per process cycle, wherein the horizontal extent is no more than 1.5 times the largest substrate dimension.

10. The LP-CAR of claim 1 adapted for processing multiple substrates per process cycle, wherein the substrates are presented in the processing region in a horizontal plane.

11. A low-profile, compact, atomic layer deposition reactor (LP-CAR), comprising:
    a body having a length, a width, and a height, wherein the length and height define first and second sides opposite one another, and the width and height define first and second ends opposite one another;
    a substrate processing region within the body, adapted to enclose a substrate during processing;

an inlet adapted for injecting a gas or vapor at the first end; and an exhaust exit adapted for evacuating gas and vapor at the second end;

wherein the gas inlet comprises one or more valved charge tubes for injecting one of a gas or vapor into the substrate processing region, each charge tube comprising a volume closed at one end by a remotely operable charge valve and at the other end by a remotely operable injection valve, the end having the injection valve being connected to the gas inlet, such that with the injection valve closed and the charge valve open to a source of gas or vapor under pressure the charge tube may be charged with a specific mass of the gas or vapor, and with the charge valve closed and the injection valve open the specific mass of gas or vapor may be expended into the substrate processing region.

12. The LP-CAR of claim 11 further comprising a load/unload port in the first side, the load/unload port opening to the substrate processing region and adapted for passing a substrate into and out of the substrate processing region; a retractable support pedestal extendable into the substrate processing region in the direction of the height, for supporting a substrate during processing; and a remotely-operable vacuum valve connected to the first side, the vacuum valve adapted to open and close the load/unload opening executing a vacuum seal in the closed position.

13. The LP-CAR of claim 11 adapted for processing a single substrate per process cycle.

14. The LP-CAR of claim 11 comprising two or more charge tubes adapted to be connected to separate gas and vapor sources.

15. A vertically-stacked compact atomic layer deposition reactor (VESCAR) processing unit, comprising:

a vacuum handling region having a valved load/unload opening adapted for transferring substrates to be processed into and out of the vacuum handling region;

a plurality of low profile, compact atomic layer deposition reactors (LP-CARs), each interfaced into the vacuum handling region by a valved substrate port, the plurality of LP-CARS arranged in a vertical stack one-above-the-other outside the vacuum handling region, such that the valved substrate ports of the compact reactors present a substantially vertical column of ports within the vacuum handling region; and a z-axis robot in the vacuum handling region;

wherein the z-axis robot is adapted to accept substrates transferred into the vacuum handling region by a transfer apparatus through the valved load/unload opening, to travel vertically to the level of each of the substrate ports, to extend to place substrates to and to receive substrates from each of the compact reactors through each of the valved substrate ports, and to place processed substrates on the transfer apparatus to be transferred through the load/unload port out of the vacuum handling region.

16. The VESCAR processing unit of claim 15 wherein the z-axis robot is programmable to follow pre-defined transfer sequences for substrates into the vacuum handling region, and into and out of individual ones of the compact reactors.

17. The VESCAR processing unit of claim 15 wherein individual ones of the compact reactors comprise two or more gas injectors and a gas exhaust arranged such that injected gases travel across a substrate placed in the individual compact reactor.

18. The VESCAR processing unit of claim 17 wherein an individual gas injector comprises a charge tube having a remotely-operable charge valve at one end and a remotely-operable injection valve at the other, the charge valve adapted to connect the charge tube to a pressure regulated gas supply, and the injection valve adapted to connect the charge tube into the individual compact reactor.

19. The VESCAR processing unit of claim 18 comprising two or more valved charge tubes adapted for injecting separate gases or vapors into the individual compact reactor.

20. The VESCAR processing unit of claim 19 wherein operation of the remotely-operable charge valves and injection valves is programmable to integrate injection of separate gases or vapors into individual compact reactors in concert with transfer of substrates into and out of compact reactors through the valved substrate ports.

21. The VESCAR processing unit of claim 15 combined with a cassette load/unload lock connected to the load/unload opening, the load/unload lock adapted with a vent and exhaust system and an outside door, such that a cassette of multiple unprocessed substrates may be placed into the load/unload lock, the load/unload lock may be evacuated, and individual substrates may then be transferred into and out of the individual compact reactors and back into the cassette in pre-programmed sequences.

22. The VESCAR processing unit of claim 15 combined with a cluster-tool handler connected by one transfer position to the load/unload opening, and a cassette load/unload lock connected to the cluster-tool handler, the load/unload lock adapted with a vent and exhaust system and an outside door, such that a cassette of multiple unprocessed substrates may be placed into the load/unload lock, the load/unload lock may be evacuated, and individual substrates may then be transferred through the cluster-tool handler and into and out of the individual compact reactors and back into the cassette in pre-programmed sequences.

23. The combination of claim 22 further comprising a second VESCAR processing unit connected to a second transfer position of the cluster-tool handler, such that substrates from the load/unload lock may be transferred into and out of compact reactor units in either of the VESACR processing units.

24. The VESCAR unit of claim 23 wherein the z-axis robot comprises a multiple end effector for handling multiple substrates.

25. The VESCAR unit of claim 15 wherein multiple substrates are processed in a horizontal array in each LP-CAR in each process cycle.

* * * * *